(12) United States Patent
Haraguchi et al.

(10) Patent No.: US 8,498,680 B2
(45) Date of Patent: Jul. 30, 2013

(54) ELECTRODE UNIT JOINING STRUCTURE FOR SUPERCONDUCTING WIRE, SUPERCONDUCTING WIRE, AND SUPERCONDUCTING COIL

(71) Applicant: Fujikura Ltd., Tokyo (JP)

(72) Inventors: Masashi Haraguchi, Sakura (JP); Shinji Fujita, Sakura (JP); Masanori Daibo, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/650,811

(22) Filed: Oct. 12, 2012

(65) Prior Publication Data

US 2013/0040819 A1     Feb. 14, 2013

Related U.S. Application Data

(63) Continuation of application No. PCT/JP2011/058774, filed on Apr. 7, 2011.

(30) Foreign Application Priority Data

Apr. 16, 2010   (JP) .................................. 2010-095377

(51) Int. Cl.
    *H01L 23/48*    (2006.01)
(52) U.S. Cl.
    USPC ........................................................ 505/190
(58) Field of Classification Search
    USPC .................................. 505/190, 230, 703, 706
    See application file for complete search history.

(56) References Cited

U.S. PATENT DOCUMENTS

| 2006/0021788 A1* | 2/2006 | Kohayashi et al. ......... 174/125.1 |
| 2007/0069339 A1* | 3/2007 | Hato ............................. 257/662 |

FOREIGN PATENT DOCUMENTS

| JP | 50-92698   A | 7/1975 |
| JP | 4-291702   A | 10/1992 |
| JP | 2001-319750 A | 11/2001 |
| JP | 2007-266149 A | 10/2007 |
| JP | 2008-117734 A | 5/2008 |
| JP | 2008-140930 A | 6/2008 |
| JP | 2008-234957 A | 10/2008 |

OTHER PUBLICATIONS

International Search Report for PCT/JP2011/058774 dated Jun. 21, 2011.

* cited by examiner

*Primary Examiner* — Colleen Dunn
(74) *Attorney, Agent, or Firm* — Sughrue Mion, PLLC

(57) ABSTRACT

An electrode unit joining structure for a superconducting wire includes: a superconducting wire comprising a first base member, a first superconducting layer provided on the first base member, and a first electroconductive layer provided on the first superconducting layer; an electrode provided on the first electroconductive layer at an end portion of the superconducting wire; and a superconducting cover tape comprising a second base member, a second superconducting layer provided on the second base member, and a second electroconductive layer provided on the second superconducting layer, the superconducting cover tape being provided so as to cover at least part of the electrode, wherein the second electroconductive layer of the superconducting cover tape is disposed on the electrode side, and the electrode, the superconducting wire, and the superconducting cover tape are electrically connected to each other.

8 Claims, 4 Drawing Sheets

ELECTRODE UNIT JOINING STRUCTURE FOR SUPERCONDUCTING WIRE, SUPERCONDUCTING WIRE, AND SUPERCONDUCTING COIL

CROSS REFERENCE TO RELATED APPLICATIONS

This application is a continuation application based on a PCT Patent Application No. PCT/JP2011/058774, filed Apr. 7, 2011, whose priority is claimed on Japanese Patent Application No. 2010-095377, filed Apr. 16, 2010, the entire content of which are hereby incorporated by reference.

BACKGROUND OF THE INVENTION

1. Field of the Invention

The present invention relates to an electrode unit joining structure for a superconducting wire, a superconducting wire, and a superconducting coil.

2. Description of the Related Art

In recent years, various equipment devices as electric power application equipment using a superconducting wire that is obtained by processing a superconductor into the wire rod have been developed. For example, a superconducting magnetic energy storage (hereinafter, simply referred to as "SMES") has characteristics such as an energy input and output speed that is faster than other energy storages, and thus has been actively developed. In addition, development of an AC coil represented by a transformer, a superconducting rotator represented by a motor or a power generator, a fault current limiter that uses a wire rod that is highly resistive during normal conduction, and the like have been progressing. As this superconductor, metal-based superconductors or oxide-based superconductors have been known.

When not cooled to an extremely low temperature such as approximately 4.2 K, metal-based superconductors such as NbTi and $Nb_3Sn$ may not obtain a superconducting state, and thus the cooling cost is high and so these conductors are not put into practical use. In addition, it is known that when a current exceeding a critical current flows, normal conduction transition is caused instantaneously in the metal-based superconductors, and thus the metal-based superconductors may not maintain a superconducting state. Therefore, when the above-mentioned metal-based superconductor is processed into a wire rod to form a coil body and this coil body is applied to the SMES, normal conduction transition occurs instantaneously in a wire rod located at a position through which a current exceeds a critical current, and as a result, there is a problem in that energy stored in the coil is released.

On the other hand, in the case of using a Bi (bismuth)-based or Y (yttrium)-based oxide superconducting wire, a superconducting transition temperature of the superconducting wire is relatively high, and liquid nitrogen at 77.3 K may be used as a cooling material that causes the wire rod to be in a superconducting state, and thus the cooling cost may be greatly reduced. In addition, in the case of the Bi-based or Y-based oxide superconducting wire, even when a current exceeding the critical current is made to flow, when it is within a temperature range called a magnetic flux region, the normal conduction transition is not caused to occur and the superconducting state may be maintained. Therefore, an application utilizing an advantage of this oxide superconducting wire has been anticipated.

In recent years, in a tape-shaped Y-based oxide superconducting wire, a wire rod, which has a superconducting characteristic in which the critical current is approximately 100 A to 300 A with a tape width of 5 mm when the wire rod is cooled to 77.3 K by liquid nitrogen and an external magnetic field is set to 0 T, has become available. This oxide superconducting wire may be used, for example, as a pancake type coil (a pancake coil) or the like. This pancake coil is a coil that is formed by concentrically winding the tape-shaped oxide superconducting wire around a cylindrical winding frame, and a superconducting coil, to which external connection electrodes are attached at a leading end portion and a trailing end portion of the superconducting wire, respectively, has been disclosed (for example, refer to Japanese Unexamined Patent Application, First Publication No. 2008-140930 to be described below).

The superconducting coil that is disclosed in Japanese Unexamined Patent Application, First Publication No. 2008-140930 is a pancake coil that is formed by winding a thin film superconducting wire having a multi-layer structure in which one surface side is a superconducting layer side and the other surface side is a substrate side. An inner electrode is provided on an inner circumferential surface at a leading end of the innermost turn and an outer electrode is provided on an outer circumferential surface at a leading end of the outermost turn of the thin film superconducting wire, respectively.

However, when energization is carried out with respect to the superconducting coil having a structure disclosed in Japanese Unexamined Patent Application, First Publication No. 2008-140930 through an electrode from an external excitation power supply, due to an increase in temperature, which is caused by heat permeating from the outside and heat dissipation at a connection portion, normal conduction transition in which a superconductor in the vicinity of the electrode transitions from a superconducting state to a normal conduction state occurs, and thus there is a problem in that burning-out of the superconducting coil may occur.

SUMMARY OF THE INVENTION

The invention was made in consideration of such conventional circumstances, and an object thereof is to provide an electrode unit joining structure for a superconducting wire, which is capable of suppressing an increase in temperature in the vicinity of an electrode, and a superconducting wire and a superconducting coil, which are capable of preventing burning-out therein by suppressing occurrence of normal conduction transition in the vicinity of the electrode.

To solve the above-described problem, the invention adopts the following configurations.

A superconducting wire of an aspect of the invention includes: a first base member, a first superconducting layer provided on the first base member, and a first electroconductive layer provided on the first superconducting layer; an electrode provided on the first electroconductive layer at an end portion of the superconducting wire; and a superconducting cover tape comprising a second base member, a superconducting layer provided on the second base member, and a second electroconductive layer provided on the second superconducting layer, the superconducting cover tape being provided so as to cover at least part of the electrode. The second electroconductive layer of the superconducting cover tape is disposed on the electrode side, and the electrode, the superconducting wire, and the superconducting cover tape are electrically connected to each other.

The electrode unit joining structure for a superconducting wire may further include a buffering member filling a gap between the superconducting wire, the superconducting cover tape, and the electrode.

The buffering member may be formed from a thermosetting resin.

The electrode, the superconducting wire, and the superconducting cover tape may be electrically connected to each other through a solder.

A superconducting wire of another aspect of the invention includes the above-described electrode unit joining structure.

A superconducting coil of another aspect of the invention is provided with the electrode unit joining structure. The superconducting coil includes a coil body formed from a superconducting wire, and the superconducting wire is wound in a state where an electroconductive layer side surface thereof faces the outside.

ADVANTAGEOUS EFFECTS OF INVENTION

According to the electrode unit joining structure for a superconducting wire according to the aspect of the invention, the electrode unit joining structure for a superconducting wire is configured in such a manner that the superconducting cover tape is provided so as to cover a top surface of the electrode that is provided at the end portion of the superconducting wire, a stabilizing layer (electroconductive layer) of the superconducting wire and a stabilizing layer (electroconductive layer) of the superconducting cover tape are joined on the top surface and a bottom surface of the electrode, respectively, and the electrode, the superconducting wire, and the superconducting cover tape are electrically connected to each other. According to this configuration, a current that flows to the superconducting wire in the vicinity of the electrode and the superconducting cover tape, respectively, becomes small, and thus Joule heat that occurs due to a contact resistance between the electrode and the superconducting wire may be decreased. Therefore, an increase in temperature of the electrode may be suppressed, and thus an increase in temperature of the superconducting wire in the vicinity of the electrode and normal conduction transition may be suppressed, and burning-out of the superconducting wire may be prevented from occurring.

In addition, when the superconducting wire is cooled by a coolant or the like, members at the periphery thereof are also conductively cooled. The electrode unit joining structure for a superconducting wire according to the aspect of the invention is configured in such a manner that the superconducting wire member is disposed on one-side surface of the electrode and the superconducting cover tape is disposed on the other-side surface of the electrode in order for the superconducting wire and the superconducting cover tape to be electrically connected to the electrode. According to this configuration, compared to a conventional electrode unit joining structure of a superconducting wire, the electrode may be effectively cooled also through the superconducting cover tape, an increase in temperature of the electrode due to heat permeating from the outside may be suppressed, and thus occurrence of normal conduction transition of the superconducting wire may be suppressed. As a result, burning-out of the superconducting wire may be prevented from occurring.

In addition, the electrode unit joining structure for a superconducting wire according to the aspect of the invention is configured in such a manner that a gap formed between the superconducting wire, the superconducting cover tape, and the electrode is filled with the buffering member. According to this configuration, even when a mechanical force is applied during bending, distortion, and the like, characteristics of the superconducting wire may be prevented from deteriorating. In addition, due to the buffering member filling it as described above, when the superconducting wire and the superconducting cover tape are cooled by a coolant or the like, the buffering member is also conductively cooled, and thus the electrode may be cooled in a relatively effective manner.

The superconducting wire according to another aspect of the invention, and the superconducting coil according to still another aspect of the invention include the electrode unit joining structure according to the aspect of the invention. According to this configuration, the electrode may be effectively cooled during conduction cooling. Therefore, an increase in temperature of the superconducting wire in the vicinity of the electrode and normal conduction transition may be suppressed, and burning-out of the electrode may be prevented from occurring.

DESCRIPTION OF THE PREFERRED EMBODIMENTS

Hereinafter, an electrode unit joining structure of a superconducting wire according to an embodiment of the invention will be described.

Figure 1A:
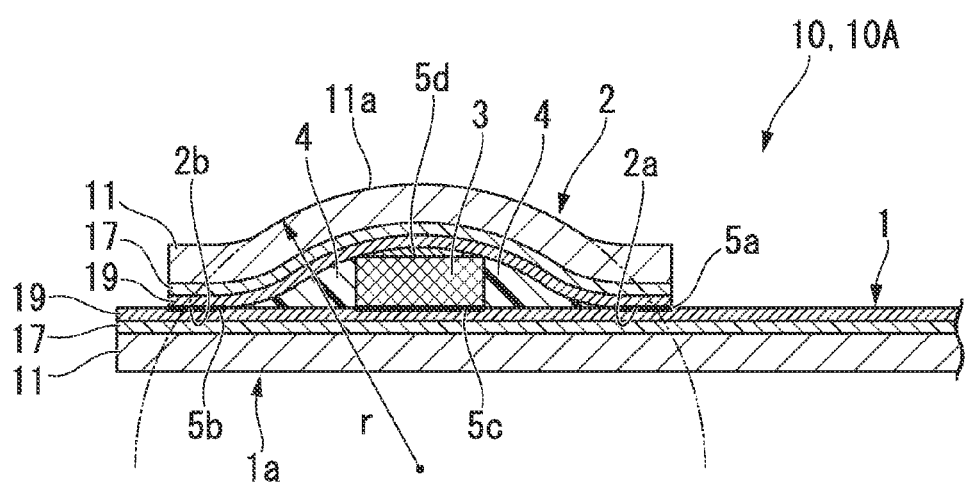
FIG. 1A is a cross-sectional diagram illustrating an electrode unit joining structure of a superconducting wire according to an embodiment of the invention.
Figure 1B:
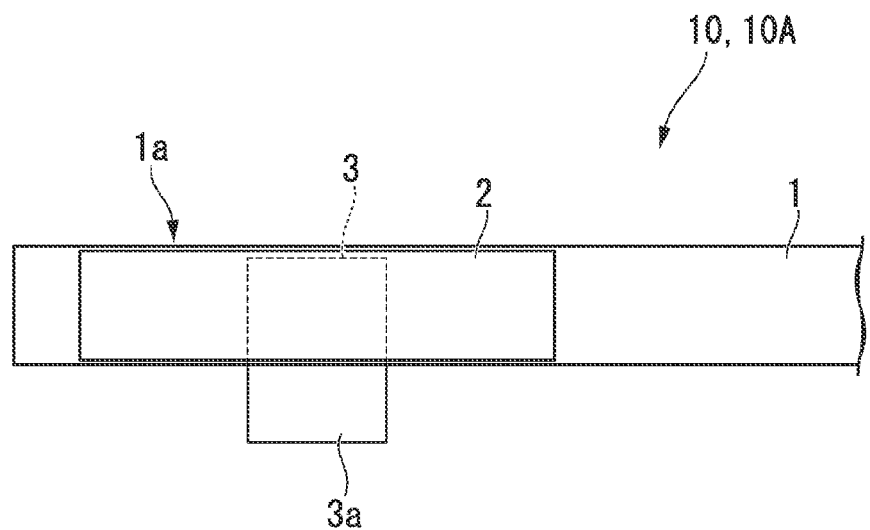
FIG. 1B is a top view illustrating the electrode unit joining structure of the superconducting wire according to the embodiment of the invention.
Figure 2:
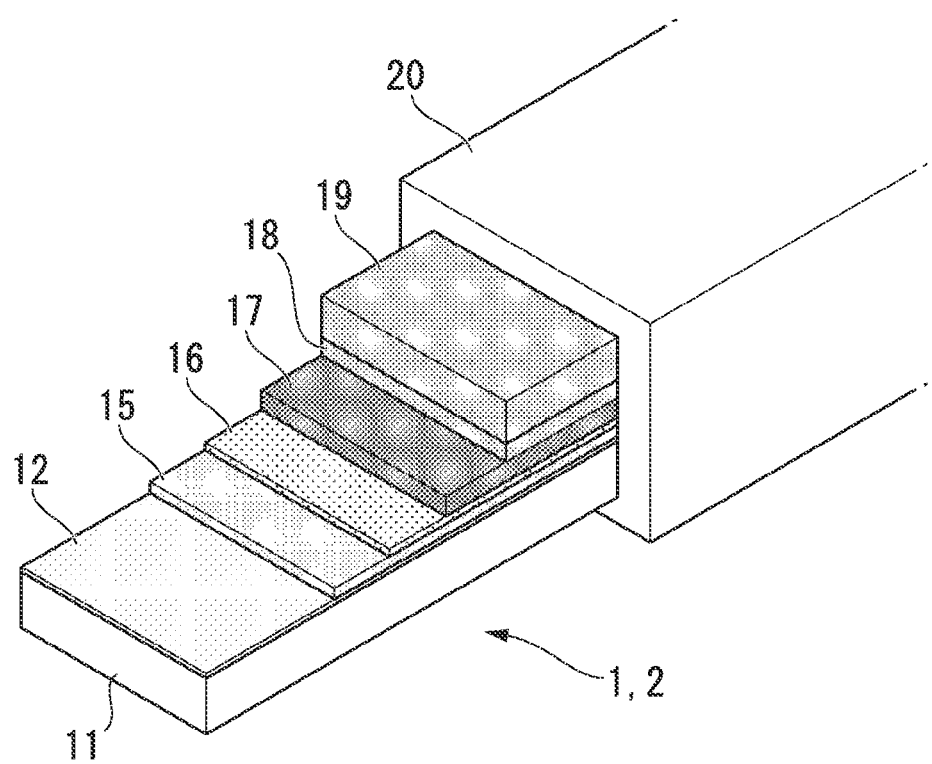
FIG. 2 is a schematic perspective diagram illustrating an example of the superconducting wire that is provided to the electrode unit joining structure shown in FIGS. 1A and 1B.

FIG. 1A shows a cross-sectional diagram illustrating an electrode unit joining structure of a superconducting wire according to an embodiment of the invention. FIG. 1B shows a top view illustrating the electrode unit joining structure of the superconducting wire according to the embodiment of the invention. In addition, FIG. 2 shows a schematic perspective diagram illustrating an example of the superconducting wire that is provided to the electrode unit joining structure shown in FIGS. 1A and 1B. In addition, in FIG. 1A, some layers of each superconducting wire are omitted for simplification of illustration.

An electrode unit joining structure 10 for a superconducting wire shown in FIGS. 1A and 1B includes a superconducting wire 1, an electrode 3 that is provided on the superconducting wire 1, and a superconducting cover tape 2, which is provided on the superconducting wire 1 so as to cover part of the electrode 3.

The superconducting wire 1 and the superconducting cover tape 2 are disposed in such a manner that surfaces (surfaces of respective stabilizing layers 19 to be described later), which are opposite to tape-shaped base members 11, come into contact with the electrode 3 to be electrically connected to the electrode 3, respectively. In addition, a gap formed between the superconducting wire 1, the superconducting cover tape 2, and the electrode 3 is filled with a buffering member 4.

As shown in FIG. 2, the superconducting wire 1 is schematically configured in such a manner that a bed layer 12, an intermediate layer 15, a cap layer 16, and an oxide superconducting layer 17 are laminated on the tape-shaped base member 11, and a stabilizing base layer 18 and a stabilizing layer (electroconductive layer) 19 are laminated on the oxide superconducting layer (superconducting layer) 17, and thus the entirety of the superconducting wire 1 is covered with an insulating coating layer 20. In addition, in the superconducting wire 1, the bed layer 12 may be omitted. In addition, as shown in FIGS. 1A and 1B, the coating layer 20 is removed at an end portion of the superconducting wire 1, and the electrode 3, the superconducting cover tape 2, and the buffering member 4 are disposed on an electrode connection terminal 1a that leads out from the coating layer 20.

The base member 11, which is applicable to the superconducting wire 1 according to this embodiment, may be used as a base member of a common superconducting wire, and preferably have high strength. It is more preferable that the base member 11 have a tape shape to realize a long cable and be formed from a heat resistant metal. Examples of the base member 11 include various metallic materials such as silver, platinum, stainless steel, copper, and nickel alloys including hastelloy, or base members a ceramic is disposed on the various metallic materials, and the like. Among various heat resistant metals, the nickel alloy is preferable.

Among these, commercially available Hastelloy (trade name, manufactured by Haynes International, Inc. in the United States of America) is preferable. As the Hastelloy, any kind of Hastelloy such as Hastelloy B, Hastelloy C, Hastelloy G, Hastelloy N, Hastelloy W, and the like in which amounts of components of molybdenum, chromium, iron, cobalt, and the like are different from each other may be used. The thickness of the base member 11 may be appropriately adjusted in accordance with a purpose, and is commonly 10 to 500 µm.

The bed layer 12 is a layer that has high heat resistance and that reduces interfacial reactivity. The bed layer 12 is used to obtain orientation of a film that is disposed thereon. This bed layer 12 is disposed according to necessity, and is formed from, for example, yttria ($Y_2O_3$), silicon nitride ($Si_3N_4$), aluminum oxide ($Al_2O_3$, also referred as "alumina"), or the like. This bed layer 12 is formed by, for example, a film forming method such as a sputtering method. The thickness of this bed layer 12 is, for example, 10 to 200 nm.

In addition, in the invention, the structure of the superconducting wire 1 is not limited to the structure shown in FIG. 2, and may be a structure in which a diffusion barrier layer is interposed between the base member 11 and the bed layer 12. The diffusion barrier layer is a layer that is formed to prevent diffusion of constituent elements of the base member 11, and is formed from silicon nitride ($Si_3N_4$), aluminum oxide ($Al_2O_3$), rare-earth metal oxide, or the like. The thickness of the diffusion barrier layer is, for example, 10 to 400 nm. In addition, crystallinity of the diffusion barrier layer does not matter, and thus the diffusion barrier layer may be formed by a common film forming method such as a sputtering method.

In this manner, in a case where the diffusion barrier layer is interposed between the base member 11 and the bed layer 12, when thermal hysteresis is applied as a result of necessary heating treatment at the time of forming other layers such as the intermediate layer 15, the cap layer 16, and the oxide superconducting layer 17 to be describe later, it is possible to suppress diffusion of part of constituent elements of the base member 11 to the oxide superconducting layer 17 side through the bed layer 12. In addition, when a two-layer structure of the diffusion barrier layer and the bed layer 12 is adopted, element diffusion on the base member 11 side may be effectively suppressed. As an example of interposing the diffusion barrier layer between the base member 11 and the bed layer 12, a combination in which $Al_2O_3$ is used as the diffusion barrier layer and $Y_2O_3$ is used as the bed layer 12 may be exemplified.

The intermediate layer 15 may have a single layer structure or a multi-layer structure, and is selected from biaxially oriented materials so as to control crystal orientation of the oxide superconducting layer 17 that is laminated on the intermediate layer 15. Specific examples of a material of the intermediate layer 15 include metal oxides such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, $Nd_2O_3$, and the like.

When this intermediate layer 15 is formed by an ion beam assisted deposition method (IBAD method) with satisfactory crystal orientation (for example, crystal orientation degree of 15° or less), crystal orientation of the cap layer 16 that is formed on the intermediate layer 15 may be set to a satisfactory value (for example, crystal orientation degree of approximately 5°). Due to this, crystal orientation of the oxide superconducting layer 17 that is formed on the cap layer 16 may be set to a satisfactory value to exhibit an excellent superconducting characteristic.

The thickness of the intermediate layer 15 may be appropriately adjusted in accordance with a purpose, but commonly, may be set to a range of 0.005 to 2 µm.

The intermediate layer 15 may be laminated by known methods, which form an oxide thin film, such as physical deposition methods such as a sputtering method, a vacuum deposition method, a laser deposition method, an electron beam deposition method, an ion beam assisted deposition method (hereinafter, simply referred to as "IBAD method"), and a chemical vapor deposition method (CVD method); a metal organic deposition (MOD method); thermal spraying; and the like. Particularly, the metal oxide layer that is formed by the IBAD method is preferable from the viewpoints that the metal oxide layer has high crystal orientation and is excellent in an effect of controlling crystal orientation of the oxide superconducting layer 17 or the cap layer 16. The IBAD method is a method of emitting ion beams during deposition to an underlying deposition surface at a predetermined angle to cause a crystal axis to orient. Commonly, as the ion beams, argon (Ar) ion beams are used. For example, the intermediate layer 15 that is formed from $Gd_2Zr_2O_7$, MgO, or $ZrO_2$—$Y_2O_3$ (YSZ) is particularly preferable because a value of $\Delta\Phi$ (FWHM: full width at half maximum) that is an index representing crystal orientation in the IBAD method may be made to be small.

As the cap layer 16, a layer, which is formed through process in which epitaxial growth occurs with respect to a surface of the intermediate layer 15 and then grain growth (overgrowth) occurs in a transverse direction (surface direction), and thus a crystal grain selectively grows in an in-plane direction, is preferable. In this cap layer 16, it is possible to obtain a degree of in-plane orientation higher than that of the intermediate layer 15 formed from the metal oxide layer.

A material of the cap layer 16 is not particularly limited as long as the material exhibiting the above-described function. Specifically, examples of a preferable material include $CeO_2$, $Y_2O_3$, $Al_2O_3$, $Gd_2O_3$, $Zr_2O_3$, $Ho_2O_3$, $Nd_2O_3$, and the like. In a case where the material of the cap layer is $CeO_2$, the cap layer 16 may contain Ce-M—O-based oxide in which part of Ce is substituted with another metal atom or metal ion.

This $CeO_2$ layer may be formed by a PLD method (pulse layer deposition method), a sputtering method, or the like, but the PLD method is preferably used from the viewpoints that a large film forming rate may be obtained. The PLD method may be carried out in an oxygen gas atmosphere in which a temperature of a base member is approximately 500 to 1,000°

C., and a pressure is approximately 0.6 to 100 Pa as a $CeO_2$ layer forming condition by the PLD method.

It is necessary for the film thickness of the $CeO_2$ layer to have 50 nm or more, but 100 nm or more is preferable to obtain sufficient orientation, and more preferably 500 nm or more. However, when the film thickness is too large, the crystal orientation deteriorates, and thus the film thickness is preferably set to 500 to 1,000 nm.

The oxide superconducting layer 17 may be a known layer, and specifically, a layer formed from a material of $REBa_2Cu_3O_y$ (here, RE represents a rare-earth element such as Y, La, Nd, Sm, Er, and Gd) may be exemplified. As this oxide superconducting layer 17, $Y123(YBa_2Cu_3O_{7-x})$, $Gd123(GdBa_2Cu_3O_{7-x})$, and the like may be exemplified.

In addition, a layer, which is formed from another oxide superconductor, for example, an oxide superconductor of a composition that is represented by $Bi_2Sr_2Ca_{n-1}Cu_nO_{4+2n+\delta}$, and that has a high critical temperature, may be used.

It is preferable that the thickness of the oxide superconducting layer 17 be approximately 0.5 to 5 μm and be uniform.

The oxide superconducting layer 17 may be laminated by a physical deposition method such as a sputtering method, a vacuum deposition method, a laser deposition method, an electron beam deposition method, and a chemical vapor deposition method (CVD method); an application and thermal decomposition method (MOD method); or the like. Among these, it is preferable to use a TFA-MOD method (metalorganic deposition method using trifluoroacetate, coating and thermal decomposition), a PLD method, or a CVD method from the viewpoints of productivity.

This MOD method is a method of carrying out application of a metal organic acid salt and pyrolysis of this salt. In the MOD method, a solution in which an organic compound of a metallic component is uniformly dissolved is applied on a base member and the resultant applied material is heated to pyrolyze, whereby a thin film is formed on the base member. Therefore, a vacuum process is not necessary and thus high-speed film formation is possible with low cost. Therefore, the MOD method is suitable for manufacturing of a long tape-shaped oxide superconductor.

Here, as described above, when the oxide superconducting layer 17 is formed on the cap layer 16 having a satisfactory orientation, the oxide superconducting layer 17 that is laminated on this cap layer 16 is also crystallized to be consistent with the orientation of the cap layer 16. Therefore, in the oxide superconducting layer 17 that is formed on the cap layer 16, disturbance in the crystal orientation hardly occurs. In addition, in each of crystal grains making up the oxide superconducting layer 17, a c-axis to which electricity is not likely to flow is oriented in a thickness direction of the base member 11, and an a-axis or a b-axis is oriented in a longitudinal direction of the base member 11. Therefore, in the oxide superconducting layer 17 that is obtained, quantum bonding properties at grain boundaries are excellent and a superconducting characteristic at the grain boundary hardly deteriorates, and thus it is easy for electricity to flow in the longitudinal direction of the base member 11. As a result, a sufficiently high critical current density may be obtained.

The stabilizing base layer 18 that is laminated on the oxide superconducting layer 17 is formed as a layer formed from a metallic material such as Ag which has satisfactory conductivity and in which contact resistivity with the oxide superconducting layer 17 is low and affinity therewith is satisfactory.

The stabilizing layer 19 is formed from a metallic material having satisfactory conductivity, and functions as a bypass that commutates a current of the oxide superconducting layer 17 together with the stabilizing base layer 18 when the oxide superconducting layer 17 is apt to transition from a superconducting state to a normal conduction state.

As the metallic material making up the stabilizing layer 19, a material having satisfactory conductivity is preferable and is not particularly limited. However, it is preferable to use a relatively cheap material such as Cu. Due to this, the film thickness of the stabilizing layer 19 may be made to be large while suppressing the material cost to be low. Therefore, the superconducting wire 1, which withstands a fault current, may be obtained at a lower cost.

As shown in FIGS. 1A and 1B, in the electrode connection terminal 1a that is an end portion of the superconducting wire 1 configured as described above, the electrode 3 is joined to a surface of the stabilizing layer 19 of the superconducting wire 1 through a joining portion 5c. Furthermore, the superconducting cover tape 2 is provided on the electrode connection terminal 1a of the superconducting wire 1 so as to cover part of the electrode 3.

As an electrode material of the electrode 3, a conventionally-known material may be used, and examples of this material include metals having high conductivity such as gold, platinum, silver, copper, and an alloy containing at least one kind of these metals. Among these, copper is preferable. A size of the electrode 3 may be appropriately adjusted in a range at which distortion (bending) of the superconducting cover tape 2 to be described later does not become too large and the superconducting characteristic does not deteriorate significantly. In addition, the length of the electrode 3 in a width direction of the superconducting wire 1 is set to be longer than the width of the superconducting wire 1 as shown in FIG. 1B, part of the electrode 3 is covered with the superconducting cover tape 2 to be described later, and a portion that is not covered with the superconducting cover tape 2 and is exposed functions as a lead portion 3a that electrically connects between the electrode 3 and an external excitation power supply (not shown). In this manner, when the electrode 3 and the lead portion 3a are formed by a single plate-shaped metal (for example, when a line width of the superconducting wire 1 is 5 mm, a copper plate in which a width is 20 mm, a length is 50 mm, and a thickness is 5 mm may be used), a process of providing the lead portion to the electrode 3 may be omitted. In addition, the electrode 3 may be provided in such a manner that part or entirety of the electrode 3 is covered with the superconducting cover tape 2, and a lead portion, which is formed from a material having different conductivity, may be provided to be electrically connected with the electrode 3. In the case of separately providing the lead portion to the electrode 3, the lead portion may be provided to the electrode 3 by a common joining method such as joining by using solder.

The joining between the electrode 3 and the superconducting wire 1 through the joining portion 5c may be carried out in an electrical manner or in a mechanical manner, and for example, may be carried out by soldering, ultrasonic welding, resistive welding, a conductive adhesive, or the like. As the joining portion Sc that joins the electrode 3 and the superconducting wire 1, solder is preferable from the viewpoints of general-purpose properties, joining properties, and easiness of handling. The solder is not particularly limited, and examples of the solder include Pb—Sn-based alloy solder, lead-free solder such as an Sn—Ag-based alloy, an Sn—Bi-based alloy, an Sn—Cu-based alloy, and an Sn—Zn-based alloy, process solder, low-temperature solder, and the like. One kind or two kinds or more of the solder may be used in combination. Among these, it is preferable to use solder in which a melting point is 300° C. or less. Due to this, soldering may be carried out at a temperature of 300° C. or less, and thus leakage of oxygen of the oxide superconducting layer 17 due to soldering heat may be suppressed, thereby suppressing characteristic deterioration thereof For superconducting cover tape 2, the same material as the superconducting wire 1 may be used.

Here, the superconducting wire 1 and the superconducting cover tape 2 may have the same layer configuration (a kind of layers that is provided and a constituent material thereof are same), or layer configurations different from each other. In the case of having the same layer configuration, since the superconducting wire 1 may be used as the superconducting cover tape 2 by cutting part of the superconducting wire 1 or by bending an end portion of the superconducting wire 1 in order for the stabilizing layer 19 to be located at the inner side thereof, and thus this case is simple. In this embodiment, a case in which the superconducting cover tape 2 and the superconducting wire 1 have the same layer configuration is described as an example. The superconducting cover tape 2 includes the base member 11, the bed layer 12, the intermediate layer 15, the cap layer 16, the oxide superconducting layer 17, the stabilizing base layer 18, and the stabilizing layer (electroconductive layer) 19.

The superconducting cover tape 2 is disposed in such a manner that a surface of the stabilizing layer 19 is opposite to a surface of the electrode connection terminal 1a of the superconducting wire 1 (a surface of the stabilizing layer 19 of the superconducting wire 1) and a top surface of the electrode 3. The surfaces 2a and 2b of the stabilizing layer 19 at both end portions of the superconducting cover tape 2 are joined to a surface of the stabilizing layer 19 of the superconducting wire 1 through joining portions 5a and 5b. In addition, a surface of the stabilizing layer 19 of the superconducting cover tape 2 and the electrode 3 are joined through a joining portion 5d.

The joining between the superconducting cover tape 2 and the electrode 3 through the joining portion 5d may be carried out in an electrical manner or mechanical manner, and may be carried out by the same method as the above-described joining between the superconducting wire 1 and the electrode 3. The same joining as the joining portion 5c may be exemplified for the joining portion 5d. In addition, the joining between the surfaces 2a and 2b of the stabilizing layer 19 at the both end portions of the superconducting cover tape 2 and the surface of the stabilizing layer 19 of the superconducting wire 1 through the joining portions 5a and 5b, respectively, may be carried out by the same method. The same joining as the joining portion 5c may be exemplified for the joining 5a and 5b.

It is preferable that the joining (joining portion 5c) between the surface of the stabilizing layer 19 of the superconducting wire 1 and the bottom surface of the electrode 3, and the joining (joining portion 5d) between the stabilizing layer 19 of the superconducting cover tape 2 and the top surface of the electrode 3 be simultaneously carried out by soldering or the like. When the joining at respective joining portions is carried out simultaneously, it is possible to shorten the time necessary for connection. When the joining portions 5c and 5d are heated by the soldering or the like, heat propagates to the oxide superconducting layer 17 and thus deterioration of a superconducting characteristic due to leakage of oxygen of the oxide superconductor may be suppressed. In addition, when the joining is performed simultaneously, positional deviation of the electrode 3 due to melting of the joining portion 5c may be suppressed. In addition, when laying out the superconducting cover tape 2, since the electrode 3 and the stabilizing layer 19 of the superconducting wire 1 are joined through the joining portion 5c, only the surfaces 2a and 2b of the superconducting cover tape 2 at both end portions thereof and the surface of the superconducting wire 1 are jointed through the joining portions 5a and 5b, and joining portion 5d for the joining between superconducting cover tape 2 and the electrode 3 may be omitted. In this case, it is necessary for the superconducting cover tape 2 to be disposed so that the stabilizing layer 19 of the superconducting cover tape 2 and the electrode 3 come into contact with each other, and this contact state is maintained in order for the superconducting cover tape 2 and the electrode 3 to be electrically connected to each other.

It is preferable that joining positions (surfaces of the superconducting cover tape 2 at both ends portions thereof) 2a and 2b between the superconducting wire 1 and the superconducting cover tape 2 be sufficiently spaced from the electrode 3. Specifically, it is preferable to set the joining positions 2a and 2b so that the radius of curvature r of a surface 11a of the base member 11 of the superconducting cover tape 2 exceeds 11 mm. When the radius of curvature r is equal to or less than 11 mm, a degree of bending of the of the superconducting cover tape 2 becomes large, and thus large distortion occurs at the oxide superconducting layer 17 of the superconducting cover tape 2. Therefore, there is a concern that a superconducting characteristic of the oxide superconducting layer 17 of the superconducting cover tape 2 deteriorates and thus a joining property deteriorates. In addition, since the electrode 3 and the joining positions 2a and 2b close too much, heat dissipation at the joining positions 2a and 2b and heat dissipation at the electrode 3 overlap and thus a superconducting characteristic of the superconducting wire 1 may deteriorate.

A conventionally-known electrode unit joining structure for a superconducting wire is configured in such a manner that an electrode is provided at an end portion of the superconducting wire and a surface of the electrode other than a joining surface is exposed to external air. When conduction cooling is carried out with respect to the superconducting wire and a superconducting coil that have the electrode unit joining structure having a conventional configuration, an increase in temperature of the electrode occurs due to heat permeating from the outside and occurrence of Joule heat caused by connection resistance between the electrode and the superconducting wire, and thus a temperature of the superconducting wire in the vicinity of the electrode increases. In this way, when the temperature of the superconducting wire increases, normal conduction transition from a superconducting state to a normal conduction state is apt to occur at a portion of the superconducting wire that is close to the electrode, and thus resistance at this portion becomes large instantaneously. Therefore, there is a concern that burning-out of the superconducting wire may occur.

On the contrary to this, the electrode unit joining structure 10 for a superconducting wire according to this embodiment adopts a structure in which the superconducting cover tape 2 is provided so as to cover the top surface of the electrode 3 that is provided at an end portions of the superconducting wire 1, and the stabilizing layer 19 of the superconducting wire 1 and the stabilizing layer 19 of the superconducting cover tape 2 are joined to the top surface and the bottom surface of the electrode 3, respectively in order for these to be electrically joined to each other. Therefore, a current flowing through each of the superconducting wire 1 and the superconducting cover tape 2 in the vicinity of the electrode 3 becomes small, and thus Joule heat that occurs due to contact resistance between the electrode 3 and the superconducting wire 1 may be made to be small.

Therefore, since an increase in temperature of the electrode 3 may be suppressed, an increase in temperature of the superconducting wire 1 in the vicinity of the electrode 3 and the normal conduction transition may be suppressed, and thus burning-out of the superconducting wire 1 may be prevented from occurring.

In addition, since the superconducting wire 1 is cooled during conduction cooling, similarly to this embodiment, when the superconducting wire 1 is disposed on one-side surface of the electrode 3 and the superconducting cover tape 2, which has the same configuration as the superconducting wire 1, is disposed on the other-side surface of the electrode 3, the electrode 3 may be cooled in a more effective manner than a conventional electrode unit joining structure for a superconductor wiring material. In addition, an increase in temperature of the electrode 3 due to heat permeating from the outside is suppressed, and thus burning-out of the superconducting wire 1, which is caused by normal conduction transition, may be suppressed.

In the electrode unit joining structure 10 for a superconducting wire according to this embodiment, as shown in FIG. 1A, it is preferable that a gap formed between the superconducting wire 1 be filled with the buffering member 4, the superconducting cover tape 2, and the electrode 3. Due to the buffering member 4 filling it, even in a case where a mechanical force is applied due to bending, distortion, or the like, characteristics of the superconducting wire 1 may be prevented from deteriorating. Furthermore, since the buffering member 4 fills it as described above, when the superconducting wire 1 and the superconducting cover tape 2 are cooled by a coolant or the like, the buffering member 4 is also conductively cooled, and thus the electrode 3 may be cooled in a relatively effective manner.

The buffering member 4 is preferably formed from a thermosetting resin or the like. As the buffering member 4, for example, an epoxy-based resin containing a glass resin, or the like may be exemplified. However, a material may be used as long as this material fills the gap formed between the superconducting wire 1, the superconducting cover tape 2, and the electrode 3 and is capable of increasing the mechanical strength of the electrode unit joining structure 10. In a case where the buffering member 4 is formed from the thermosetting resin, when this thermosetting resin is heated and cured, the electrode unit 3 and the lead portion 3a may be integrated with the superconducting wire 1 and the superconducting cover tape 2. Due to this configuration, the mechanical strength may further increase. In addition, in a case where the buffering member 4 is formed from the thermosetting resin, it is preferable that after the joining (electrode-wire rod joining process) between the superconducting wire 1, the electrode 3, and the superconducting cover tape 2, the thermosetting resin fill a gap formed between the superconducting wire 1, the electrode 3, and the superconducting cover tape 2, and the thermosetting resin be heated at a temperature lower than a heating temperature of the electrode-wire rod to be cured. Specifically, for example, in the electrode-wire rod joining process, after carrying out the joining of the joining portions 5a to 5d by soldering at 180° C., the thermosetting resin fills in the gap, and this resin is heated at 150° C. for three hours to form the buffering member 4. When the temperature in the process of forming the buffering member 4 is set to be lower than a temperature in the electrode-wire rod joining process, melting of the joining of the electrode 3 and positional deviation thereof may be suppressed.

Next, a superconducting wire according to an embodiment of the invention will be described.

A superconducting wire 10A according to this embodiment is provided with the electrode unit joining structure 10 for a superconducting wire at an end portion thereof. The end portion of the superconducting wire 10A according to this embodiment has the same layer configuration and structure as the electrode unit joining structure 10 shown in FIGS. 1A and 1B. A portion other than the end portion has the same layer configuration and structure as the superconducting wire 1 shown in FIG. 2.

The superconducting wire 10A according to this embodiment is provided with electrode unit joining structure 10 according to this embodiment, and thus the electrode 3 may be cooled in an effective manner during conduction cooling. In addition, an increase in temperature of the superconducting wire 1 in the vicinity of the electrode 3 and normal conduction transition may be suppressed, and thus burning-out may be prevented from occurring.

Subsequently, a superconducting coil according to an embodiment of the invention will be described.

Figure 3:
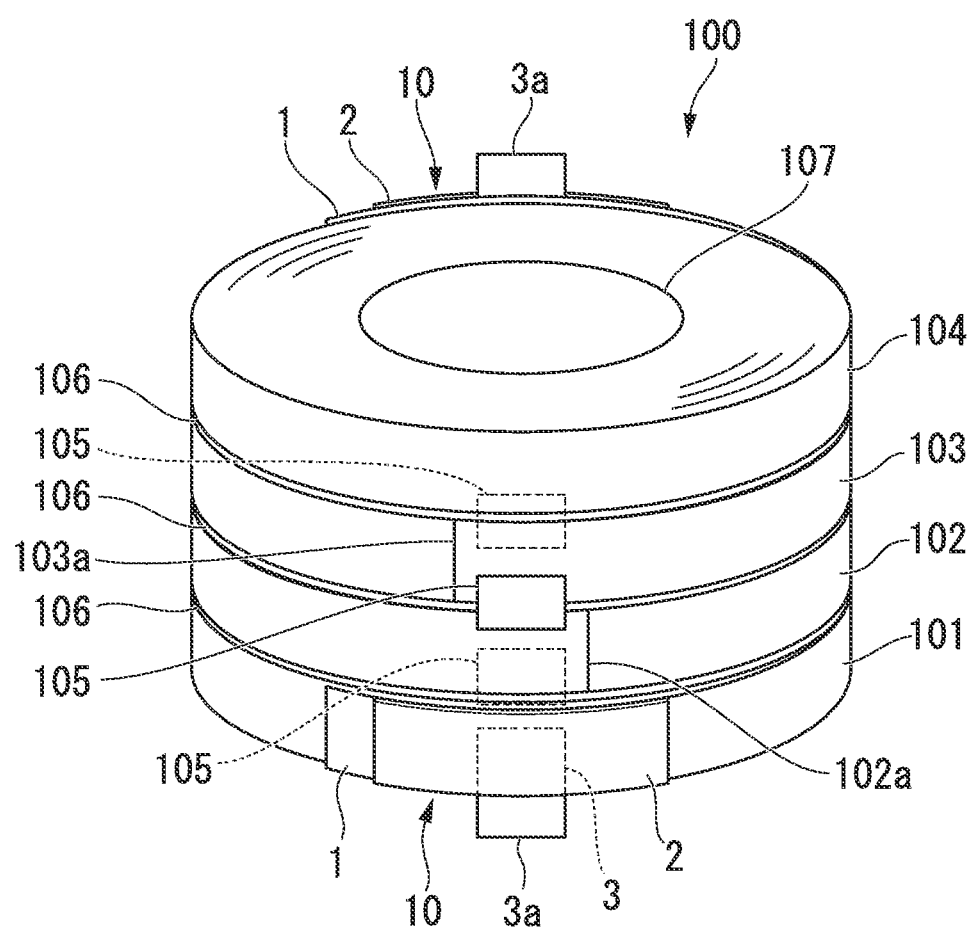
FIG. 3 is a schematic perspective diagram illustrating a superconducting coil according to an embodiment of the invention.

FIG. 3 shows a schematic perspective view showing a superconducting coil 100 according to this embodiment of the invention.

The superconducting coil 100 is configured by coaxially stacking a first coil body 101, a second coil body 102, a third coil body 103, and a fourth coil body 104 in a sequential manner.

The first coil body 101 is a pancake-type coil body that is configured by concentrically winding the superconducting wire 10A around a cylindrical winding frame 107 in a clockwise direction a plurality of times, in which a surface of the stabilizing layer 19 faces the outside. The second coil body 102 is a pancake-type coil body that is configured by concentrically winding the superconducting wire 1 around the cylindrical winding frame 107 in a counter-clockwise direction a plurality of times, in which a surface of the stabilizing layer 19 faces the outside. The second coil body 102 is laminated on an upper side of the first coil body 101 through a partition frame 106 that is formed from an insulating prepreg sheet. The third coil body 103 is a pancake-type coil body that is configured by concentrically winding the superconducting wire 1 around the cylindrical winding frame 107 in a clockwise direction a plurality of times, in which a surface of the stabilizing layer 19 faces the outside. The third coil body 103 is laminated on an upper side of the second coil body 102 through the partition frame 106. The fourth coil body 104 is a pancake-type coil body that is configured by concentrically winding the superconducting wire 10A around the cylindrical winding frame 107 in a counter-clockwise direction a plurality of times, in which a surface of the stabilizing layer 19 faces the outside. The fourth coil body 104 is laminated on an upper side of the third coil body 103 through a partition frame 106.

The first coil body 101 is provided with the electrode unit joining structure 10 at an outer circumferential end portion that is a winding distal end. Part of the electrode 3, which is disposed on the superconducting wire 1, is covered with the superconducting cover tape 2, and thus the superconducting wire 1, the electrode 3, and the superconducting cover tape 2 are electrically connected. The lead portion 3a that is integrally formed with the electrode 3 is connected to an external excitation power supply (not shown).

Similarly to the first coil body 101, the fourth coil body 104 is also provided with the electrode unit joining structure 10 at an outer circumferential end portion thereof, and includes the electrode 3 covered with the superconducting cover tape 2 and the lead portion 3a that is integrally formed with the electrode 3. An outer circumferential end portion 102a of the second coil body 102 and the end portion 103a of the third coil body 103 are configured, respectively, in such a manner that the coating layer 20 of the superconducting wire 1 shown in FIG. 2 is removed and thus the stabilizing layer 19, which leads out from the coating layer 20, is exposed to the outside. The respective end portions 102a and 103a are disposed to be adjacent to each other. In addition, on the respective stabilizing layers 19 at the respective end portions 102a and 103a, a connection plate 105, which is formed from a material such as copper having high conductivity, is disposed. The second coil body 102 and the third coil body 103 are electrically and mechanically connected to each other. In addition, similarly, in regard to an inner circumferential end portion of the first coil body 101 and an inner circumferential end portion of the second coil body 102, and in regard to an inner circumferential end portion of the third coil body 103 and an inner circumferential end portion of the fourth coil body 104, the inner circumferential end portions of the respective coil bodies are electrically and mechanically connected to each other by the connection plate 105. In the superconducting coil 100 of this structure, the first coil body 101 to the fourth coil body 104 are electrically connected. For example, an excitation current is input to the electrode 3 of the first coil body 101, this excitation current flows sequentially to the first coil body 101, the second coil body 102, the third coil body 103, and the fourth coil body 104, and then is output from the electrode 3 of the fourth coil body 104.

The superconducting coil 100 according to this embodiment is provided with the electrode unit joining structure 10 according to this embodiment, and thus when the superconducting coil 100 is cooled by dipping cooling in liquid nitrogen, conduction cooling with a freezing machine, or the like, the electrode 3 may be cooled in an effective manner. In addition, an increase in temperature of the superconducting wire 1 in the vicinity of the electrode 3 and normal conduction transition may be suppressed. Therefore, burning-out may be prevented from occurring.

In addition, in this embodiment, the superconducting coil 100 in which four pancake-type coil bodies are laminated is exemplified. However, the invention is not limited thereto, and the superconducting coil 100 may be formed by one to three coil bodies or five or more coil bodies.

In addition, the respective coil bodies may be formed in such a manner that the superconducting wire 1 or 10A is wound around the winding frame 107 together with an insulating tape that overlaps the superconducting wire 1 or 10A and that also has a function of impregnation fixation to form the pancake-type coil body, and then these are heated to be solidified integrally. In addition to the impregnation by the prepreg tape, a method of impregnation fixation of the coil body may be carried out by vacuum compression impregnation, impregnation by application of impregnation resin at the time of winding the superconducting wire 1 or 10A, or the like.

Hereinbefore, a description was made with respect to the electrode unit joining structure for a superconducting wire, the superconducting wire, and the superconducting coil according to this embodiment, but in the above-described embodiment, respective parts of the electrode unit joining structure for a superconducting wire, respective parts of the superconducting wire, and respective parts making up the superconducting coil are illustrative only, and may be appropriately changed without departing from the scope of the invention.

EXAMPLES

Hereinafter, the invention will be described in more detail with reference to examples, but the invention is not limited to these examples.

Example 1

$Gd_2Zr_2O_7$ (GZO; an intermediate layer) having the thickness of 1.2 μm was formed on a base member that was formed from a tape-shaped Hastelloy (trade name, manufactured by Haynes International Inc. in the United States of America) having the width of 5 mm and the thickness of 0.1 mm by an ion beam assisted deposition method (IBAD), and then $CeO_2$ (a cap layer) having the thickness of 1.0 μm was formed by a laser deposition method (PLD method). Subsequently, $GdBa_2Cu_3O_7$ (a superconducting layer) having the thickness of 1.0 μm was formed on the $CeO_2$ layer by the PLD method. Furthermore, a laminated structure body including a silver layer (a stabilizing base layer) of 5 to 10 μm and a copper layer (a stabilizing layer) having the thickness of 0.1 mm was joined on the superconducting layer to prepare a superconducting wire. An electrode, which had dimensions of width of 20 mm×length of 50 mm×thickness of 5 mm and which was formed from an oxygen-free copper, was disposed on the stabilizing layer at an end portion of the superconducting wire that was obtained as shown in FIG. 1B. A superconducting cover tape (width: 5 mm and length: 15 cm), which had the same configuration as the superconducting wire that was prepared as described above, was disposed on this electrode in a manner such that a radius of curvature r of a base member of the superconducting wire cover rod became 85 mm to prepare a superconducting wire having the electrode unit joining structure having a structure shown in FIGS. 1A and 1B. In addition, joining of the superconducting wire, the electrode, and the superconducting cover tape was carried out by soldering (Pb—Sn-based alloy solder; 60% of Sn and 40% of Pb, and a melting point of 180° C.).

Similarly, after preparing a plurality of superconducting wires and superconducting wires having the electrode unit joining structure shown in FIGS. 1A and 1B, superconducting coils having a structure shown in FIG. 3 were prepared from these superconducting wires.

Each of the superconducting coils that were obtained was subjected to conduction cooling (a cooling temperature of 30 K) by a freezing machine, and an excitation current was made to flow to the superconducting coil, whereby the electrode and the superconducting coil in the vicinity of the electrode were electrically connected without heat dissipation.

From the above-described result, according to the electrode unit joining structure for a superconducting wire, the superconducting wire, and the superconducting coil, an increase in temperature of the superconducting wire in the vicinity of the electrode and normal conduction transition may be suppressed, and it was clear that burning may be suppressed.

Example 2

A plurality of superconducting wires having the electrode unit joining structure having a structure shown in FIGS. 1A and 1B were prepared similarly to Example 1 except that a radius of curvature r of a base member of the superconducting wire cover rod was changed to 6 to 19 mm.

Figure 4:
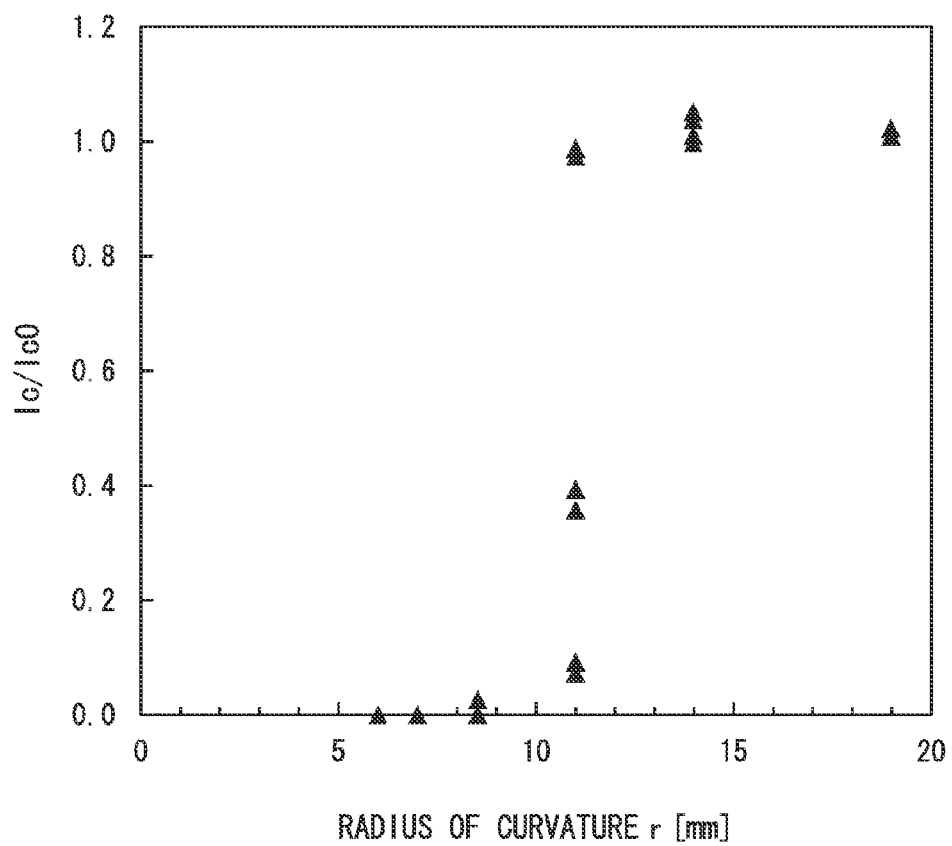
FIG. 4 is a graph illustrating a relationship between a radius of curvature r of a base member surface of a superconducting cover tape and a critical current.

With respect to the plurality of the superconducting wires that were obtained, a critical current ($I_C$) at a nitrogen temperature (77 K) was measured, and a degree of variation ($I_C/I_C0$) with respect to a critical current ($I_C0$) of the superconducting wire before the joining of the superconducting cover tape was calculated. FIG. 4 shows a relationship between ($I_C/I_C0$) and the radius of curvature r (mm) of the surface of the base member of the superconducting wire cover rod.

As shown in FIG. 4, when the radius of curvature r of the surface of the base member of the superconducting wire cover rod was 11 mm or less, the critical current was lowered. On the contrary to this, when the radius of curvature r exceeded 11 mm, it was confirmed that the critical current was not lowered and deterioration of a superconducting characteristic might be suppressed.

What is claimed is:

1. An electrode unit joining structure for a superconducting wire, comprising:
    a superconducting wire comprising a first base member, a first superconducting layer provided on the first base member, and a first electroconductive layer provided on the first superconducting layer;
    an electrode provided on the first electroconductive layer at an end portion of the superconducting wire; and
    a superconducting cover tape comprising a second base member, a second superconducting layer provided on the second base member, and a second electroconductive layer provided on the second superconducting layer, the superconducting cover tape being provided so as to cover at least part of the electrode,
    wherein the second electroconductive layer of the superconducting cover tape is disposed on the electrode side, and
    the electrode, the superconducting wire, and the superconducting cover tape are electrically connected to each other.

2. The electrode unit joining structure for a superconducting wire rod according to claim 1, further comprising:
    a buffering member filling a gap between the superconducting wire, the superconducting cover tape, and the electrode.

3. The electrode unit joining structure for a superconducting wire according to claim 2,
    wherein the buffering member is formed from a thermosetting resin.

4. The electrode unit joining structure for a superconducting wire according to claim 1,
    wherein the electrode, the superconducting wire, and the superconducting cover tape are electrically connected to each other through a solder.

5. The electrode unit joining structure for a superconducting wire according to claim 2,
    wherein the electrode, the superconducting wire, and the superconducting cover tape are electrically connected to each other through a solder.

6. The electrode unit joining structure for a superconducting wire according to claim 3,
    wherein the electrode, the superconducting wire, and the superconducting cover tape are electrically connected to each other through a solder.

7. A superconducting wire, comprising:
    the electrode unit joining structure according to claim 1.

8. A superconducting coil provided with the electrode unit joining structure according to claim 1, the superconducting coil comprising:
    a coil body formed from a superconducting wire,
    wherein the superconducting wire is wound in a state where an electroconductive layer side surface thereof faces the outside.

* * * * *